(12) United States Patent
Oka

(10) Patent No.: US 7,075,837 B2
(45) Date of Patent: Jul. 11, 2006

(54) REDUNDANCY RELIEVING CIRCUIT

(75) Inventor: Yutaka Oka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/049,298

(22) Filed: Feb. 3, 2005

(65) Prior Publication Data

US 2005/0185481 A1   Aug. 25, 2005

(30) Foreign Application Priority Data

Feb. 5, 2004   (JP) .............................. 2004-029306
Sep. 30, 2004  (JP) .............................. 2004-288737

(51) Int. Cl.
*G11C 29/00* (2006.01)
*G11C 7/00* (2006.01)

(52) U.S. Cl. ............... 365/200; 265/225.7; 265/230.06
(58) Field of Classification Search ............... 365/200, 365/225.7, 230.06

See application file for complete search history.

(56) References Cited

U.S. PATENT DOCUMENTS 5,838,621 A * 11/1998 Kim .......................... 365/200
5,905,687 A *  5/1999 Brede et al. ............. 365/225.7
6,337,815 B1    1/2002 Cho
6,552,946 B1 *  4/2003 Yokozeki ................. 365/225.7

FOREIGN PATENT DOCUMENTS

JP          2000-048589          2/2000

* cited by examiner

*Primary Examiner*—Huan Hoang
(74) *Attorney, Agent, or Firm*—Nixon Peabody LLP; Donald R. Studebaker

(57) ABSTRACT

With the object of enabling a redundancy relieving circuit to be adapted even to a high frequency operation, wirings each having a fuse are disposed in parallel with wirings for determining signals outputted from switch activating circuits.

10 Claims, 6 Drawing Sheets

REDUNDANCY RELIEVING CIRCUIT

BACKGROUND OF THE INVENTION

1. Field of the Invention

The present invention relates to a redundancy relieving circuit suitable for use in a semiconductor memory device such as a Dynamic Random Access Memory (DRAM), which is capable of obtaining a stable operation even at a high frequency.

2. Description of the Related Art

A semiconductor memory device has lattice-like wiring structures called "memory cell arrays" comprising a plurality of word lines extending in a horizontal direction and a plurality of bit lines extending in a vertical direction. Storing elements are respectively provided at points where the word lines and the bit lines intersect. They are operated by the word lines and the bit lines.

On the other hand, when a large-capacity semiconductor memory device is mass-produced, it is difficult to manufacture it without any trouble in respective bit lines because a large number of the bit lines exist within the semiconductor memory device. Therefore, spare bit lines are placed in parallel with other bit lines in advance in preparation for the occurrence of trouble in the bit lines. If trouble occurs in a bit line, a circuit is then changed in such a manner that the bit line having caused the trouble is not used, and a spare bit line is used instead. Cutting a fuse disposed within the circuit in advance performs such a circuit change. Thus, the yield of production of the semiconductor memory device is prevented from being reduced. This has been described in a patent document 1 (Japanese Unexamined Patent Publication No. 2000-48589).

The number of bit lines lying within a semiconductor memory device is increasing or building up rapidly with a recent increase in the capacity of the semiconductor memory device. With its increase, the number of fuses corresponding to the respective bit lines also increases. Since the fuses are high in resistance as compared with a normal wiring, the resistance of a wiring to which a large number of fuses are connected in series, increases. Therefore, a signal inputted to such a wiring is not immediately transferred. Thus, a problem arises in that adaptation to a high frequency operation becomes difficult.

SUMMARY OF THE INVENTION

The present invention has been made in view of the foregoing. It is therefore an object of the present invention to provide a redundancy relieving circuit adaptable to a high frequency operation.

According to one aspect of the present invention, for attaining the above object, there is provided a redundancy relieving circuit comprising an array selection circuit, an address decode circuit, and a bit line selection circuit, wherein the array selection circuit comprises first and second inverters, first and second transistors, a plurality of redundancy relieving fuses and cutoff fuses, wherein the first and second transistors are parallel-connected to one another and respectively include one main electrodes all connected to a power supply terminal, wherein each of the first inverters includes an input terminal connected to the other main electrode of the second transistor and an output terminal connected to a control electrode of the second transistor, wherein each of the second inverters includes an input terminal connected to a control electrode of the first transistor and an output terminal connected to the other main electrode of the first transistor, wherein the plurality of redundancy relieving fuses are disposed in series between the output terminals of the second inverters and the other main electrodes of the first transistors respectively, wherein each of the cutoff fuses is disposed between the output terminal of the second inverter and the other main electrode of the first transistor and in parallel with the redundancy relieving fuses, wherein the address decode circuit has address decoders, and wherein the address decode circuit selectively outputs signals sent from the address decoders to the bit line selection circuit in response to potentials among the redundancy relieving fuses in the array selection circuit.

According to another aspect of the present invention, for attaining the above object, there is provided a redundancy relieving circuit comprising an array selection circuit, an address decode circuit, and a bit line selection circuit, wherein the array selection circuit comprises first, second and third inverters, first and second transistors, a plurality of redundancy relieving fuses and cutoff fuses, wherein the first and second transistors are parallel-connected to one another and respectively include one main electrodes all connected to a power supply terminal, wherein each of the first inverters includes an input terminal connected to the other main electrode of the second transistor and an output terminal connected to a control electrode of the second transistor, wherein each of the second inverters includes an input terminal connected to a control electrode of the first transistor and an output terminal connected to the other main electrode of the first transistor, wherein each of the third inverters includes an input terminal connected to the control electrode of the first transistor and an output terminal connected to the other main electrode of the first transistor via the corresponding cutoff fuse, wherein the plurality of redundancy relieving fuses are disposed in series between the output terminals of the second inverters and the other main electrodes of the first transistors respectively, wherein the address decode circuit has address decoders, and wherein the address decode circuit selectively outputs signals sent from the address decoders to the bit line selection circuit in response to potentials among the redundancy relieving fuses in the array selection circuit.

Since another wiring is disposed in parallel with each wiring having the fuse as described above, the present invention is little affected by an increase in wiring resistance due to an increase in fuse. Thus, the present invention is easily adaptable even to a high frequency operation.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings. (Detailed description of circuit basic to the invention)

Figure 1:
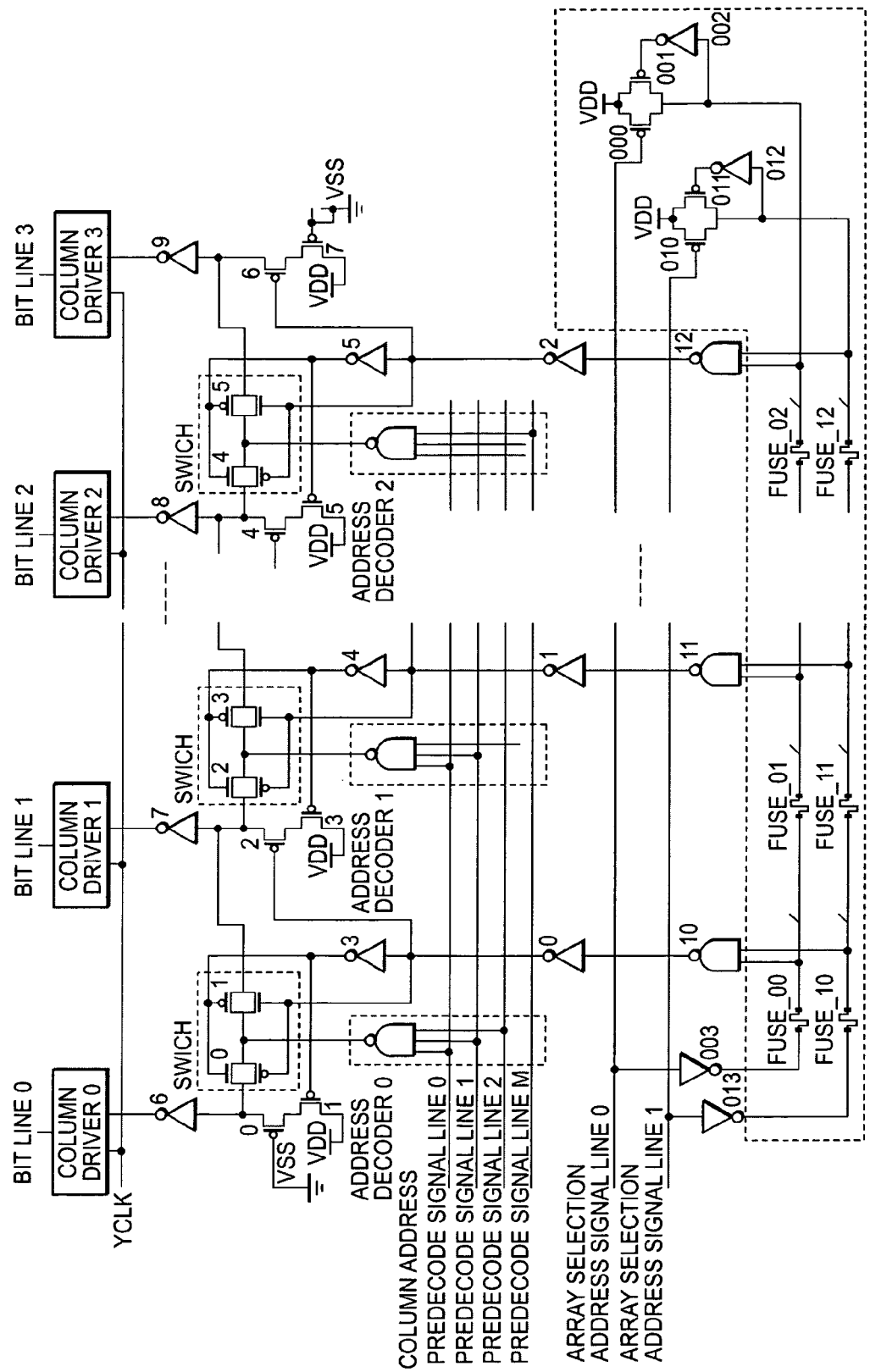
FIG. 1 is a circuit diagram showing a redundancy relieving circuit basic to the present invention.
Figure 6:
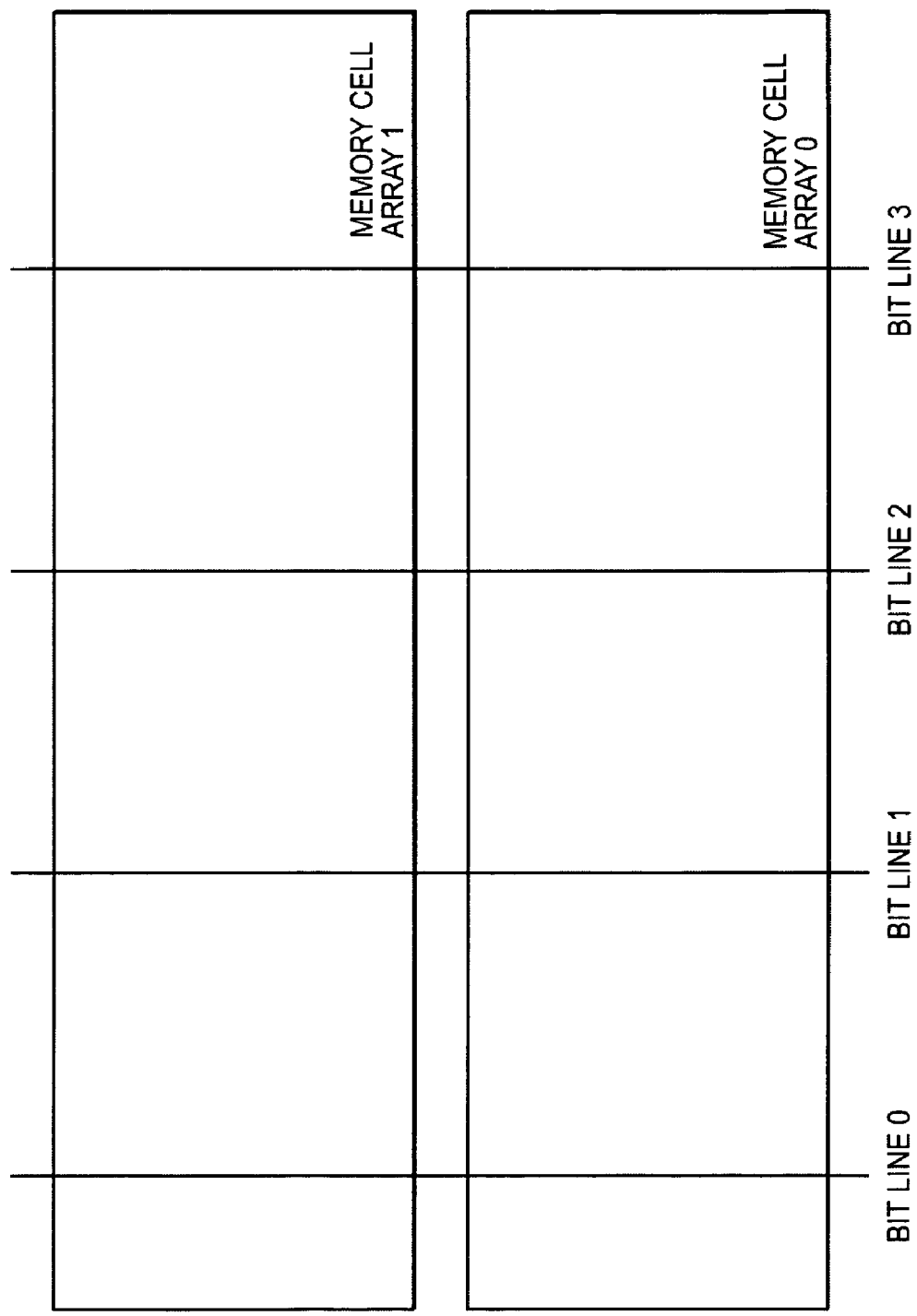
FIG. 6 is a diagram showing the relationship between bit lines and memory cell arrays.

FIG. 1 is a circuit diagram showing a redundancy relieving circuit basic to the present invention. FIG. 6 is a diagram showing memory cell arrays (arrays) connected to their corresponding redundancy relieving circuit. Prior to the description of the embodiments of the present invention, the redundancy relieving circuit basic to the present invention will first be explained in detail with reference to FIGS. 1 and 6.

The redundancy relieving circuit basic to the present invention comprises an array selection circuit, an address decode circuit and a bit line selection circuit. Incidentally, let's assume that for simplification of explanation, the number of bit lines is three and a single spare bit line different from them is provided.

The array selection circuit is a circuit which operates the arrays comprising a plurality of word lines and a plurality of bit lines, which have been disclosed in FIG. 6.

The array selection circuit comprises P type transistors (PTrs) 000 and 010 each corresponding to a first transistor, transistors PTrs 001 and 011 each corresponding to a second transistor, second inverters 003 and 013, redundancy relieving fuses (FUSEs) 00 through 02 and 10 through 12, and NAND circuits (NANDs) 10 through 12.

In the PTrs 000 and 001 and the PTrs 010 and 011, one main electrodes thereof are connected to one another and the other main electrodes thereof are connected to one another. Further, any of the one main electrodes is connected to a power supply terminal VDD. The inverter 002 is connected to the PTr 001 and the inverter 012 is connected to the PTr 011, respectively. Input terminals of both inverters are connected to their corresponding other main electrodes, and output terminals thereof are connected to their corresponding control electrodes. On the other hand, the inverter 003 is connected to the PTr 000 and the inverter 013 is connected to the PTr 010, respectively. Input terminals of both inverters are connected to their corresponding control electrodes, and output terminals thereof are connected to their corresponding other main electrodes.

Then, the FUSEs 00 through 02 and FUSEs 10 through 12 are connected in series between the output terminal of the inverter 003 and the other main electrode of the PTr 000 and between the output terminal of the inverter 013 and the other main electrode of the PTr 010, respectively. The NANDs 10 through 12 have two input terminals respectively. One input terminal of the NAND 10 is directly connected to the FUSE 00 and the FUSE 01, whereas the other input terminal thereof is directly connected to the FUSE 10 and the FUSE 11. Even in the case of the NANDs 11 and 12 in a manner similar to the NAND 10, the two input terminals thereof are directly connected to their corresponding FUSEs.

That is, the array selection circuit has a structure comprised of two analogous circuits.

On the other hand, the address decode circuit is a circuit for receiving a signal (address decode signal) for specifying the corresponding bit line in each array therein and sending the signal to the specified bit line.

The address decode circuit comprises predecode signal lines 0 through M, address decoders 0 through 2, inverters 0 through 5, transfer gates 0 through 5, PTrs 0, 2, 4 and 6 each corresponding to a third transistor, and PTrs 1, 3, 5 and 7 each corresponding to a fourth transistor.

An input terminal of the inverter 0 is connected to its corresponding output terminal of the NAND 10.

An input terminal of the inverter 3 is connected to an output terminal of the inverter 0, a P type control electrode of the transfer gate 0, an N type control electrode of the transfer gate 1 and a control electrode of the PTr 2. An output terminal of the inverter 3 is connected to an N type control electrode of the transfer gate 0, a P type control electrode of the transfer gate 1 and a control electrode of the PTr 1.

The transfer gates 0 and 1, 2 and 3, and 4 and 5 are configured in pairs two by two respectively. One main electrode of the transfer gate 0 is connected to an input terminal of an inverter 6 of a column selection circuit to be next described, whereas the other main electrode thereof is connected to one main electrode of the transfer gate 1. Further, the other main electrode of the transfer gate 1 is connected to an input terminal of an inverter 7 of the column selection circuit.

The address decoder 0 is a NAND which has M input terminals. An output terminal of the address decoder 0 is connected to the other main electrode of the transfer gate 0 and one main electrode of the transfer gate 1. The respective input terminals are connected to their corresponding predecode signal lines 0 through M.

A control electrode of the PTr 0 is connected to a ground terminal VSS. One main electrode of the PTr 1 is connected to the power supply terminal VDD. One main electrode of the PTr 0 and the other main electrode of the PTr 1 are connected to each other. The other main electrode of the PTr 0 is connected to the input terminal of the inverter 6 of the column selection circuit.

A relationship of connections among the transfer gates 0 and 1, the inverters 0, 3, 6 and 7, the address decoder 0 and the PTrs 0 through 2 has been described above. A relationship of connections among the transfer gates 2 and 3, the inverters 1, 4, 7 and 8, the address decoder 1 and the PTrs 2 through 4 is also similar to the above. Further, a relationship of connections among the transfer gates 4 and 5, the inverters 2, 5, 8 and 9, the address decoder 2 and the PTrs 4 through 6 is also similar to the above. However, the control terminals of the PTrs 2 and 4 are connected to their corresponding input terminals of the inverters 3 and 4. One main electrode of the PTr 7 is connected to the power supply terminal VDD, the other main electrode thereof is connected to one main electrode of the PTr 6, and a control terminal thereof is connected to the ground terminal VSS, respectively.

The column selection circuit is a circuit for activating a specific bit line in response to a signal delivered from the address decode circuit.

The column selection circuit comprises the inverters 6 through 9, a column driver line YCLK and column drivers 0 through 3.

The column driver 0 is inputted with outputs from the column driver line YCLK and the inverter 6. Further, the column driver 0 outputs a column selection signal to the corresponding bit line 0 shown in FIGS. 1 and 6. A relationship of connections among the column drivers 1 through 3 and the inverters 7 through 9 is also similar to above.

The bit lines 0 through 3 are common to the arrays 0 and 1 and disposed so as to extend through the arrays 0 and 1.

Figure 2:
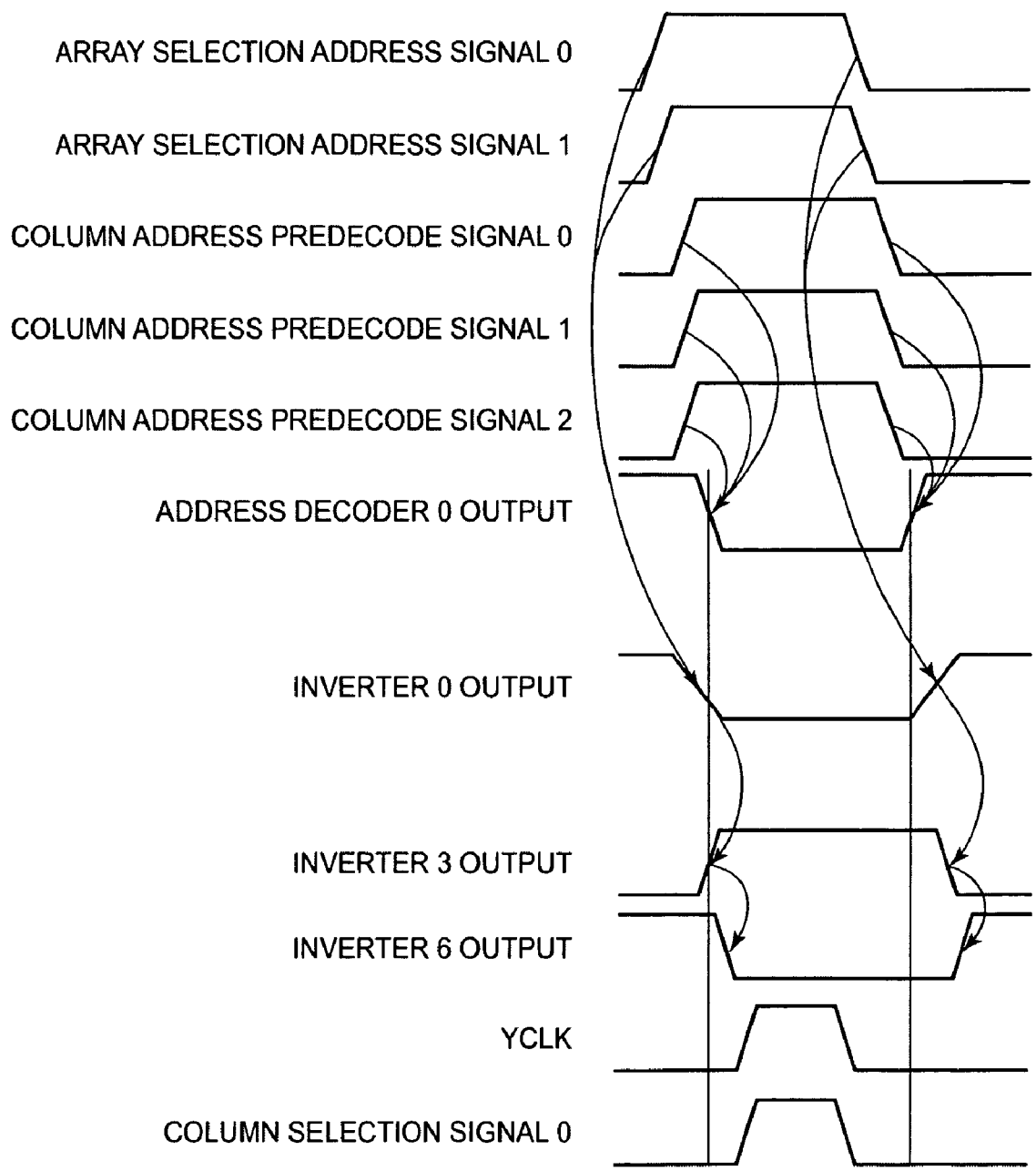
FIG. 2 is a timing chart illustrating the operation at redundant non-relief, of the redundancy relieving circuit basic to the present invention.
Figure 3:
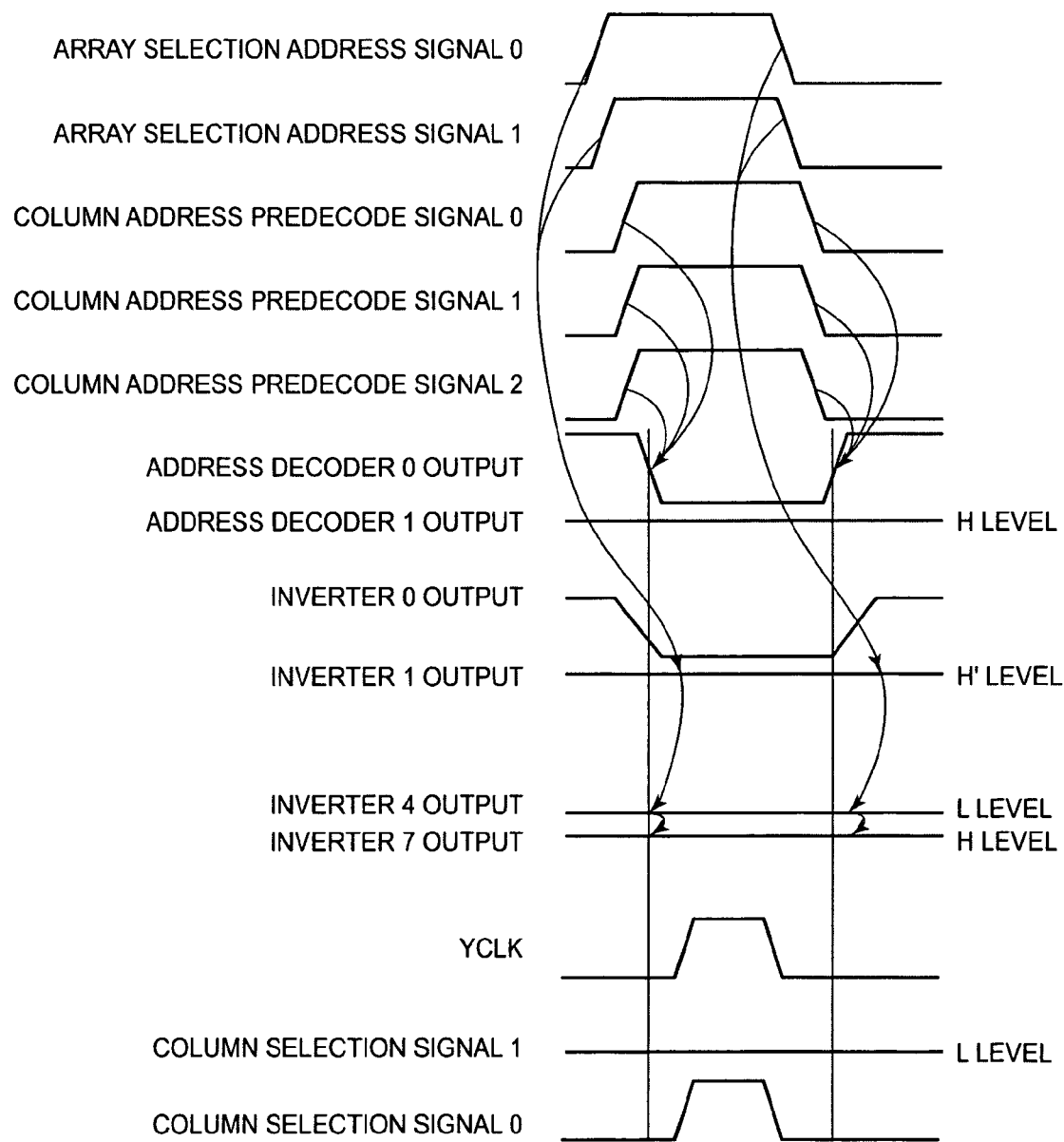
FIG. 3 is a timing chart depicting the operation at redundant relief, of the redundancy relieving circuit basic to the present invention.

FIG. 2 is a timing chart showing the operation of the conventional redundancy relieving circuit. The operation of the conventional redundancy relieving circuit will be explained using FIGS. 1, 2 and 6. A description will be made of an example in which the array 0 is activated where no problem or trouble occurs in bit lines and no spare bit line is used.

In an initial state, array selection address signals 0 and 1 are both L in level. First, the array selection address signal 0 is brought to an H level, which is inputted to the control electrode of the PTr 000 and the input terminal of the inverter 003. In doing so, the PTr 000 is turned OFF so that an L level is outputted from the inverter 003. The L level outputted from the inverter 003 is transferred via the FUSEs 00 through 02 to the inverter 002 from which an H level is outputted, so that the PTr 001 is also turned OFF. Therefore, the supply of an H level from the power supply terminal VDD is cut off and hence all potentials of the FUSEs 00 through 02 become L in level in response to the L level outputted from the inverter 003. Thus, since one input terminals of the NANDs 10 through 12 become L in level, the outputs of the NANDs 10 through 12 become H in level.

In response to the H level output produced from the NAND 10, the inverter 0 outputs an L level. Further, the inverter 3 outputs an H level in response to the L level output produced from the inverter 0. Then, the transfer gate 0 is turned ON and the transfer gate 1 is turned OFF in response to the potentials respectively outputted from the inverters 0 and 3. That is, a signal produced from the corresponding address decoder is not outputted to the inverter 7 but brought into a state of being outputted to the inverter 6.

While the address decoder 0 is outputting the H level in the initial state, the address decoder 0 outputs an L level in response to the signals delivered from the predecode signal lines 0 through M. The L level is cut off by the transfer gate 1 and passes through the transfer gate 0, followed by being supplied to the inverter 6. In doing so, the inverter 6 outputs an H level.

The H level outputted from the inverter 6 is supplied to the column driver 0 together with the H level signal of the column driver line YCLK, so that the column driver 0 outputs a column selection signal to its corresponding bit line 0.

Incidentally, although only the operations of the address decode circuit and the column selection circuit connected to the NAND 10 have been described above, the address decode circuit and the column selection circuit connected to each of the NANDs 11 and 12 are also operated in like manner. Thus, an L level signal outputted from the address decoder 1 is supplied to the column driver 1 through the inverter 7, whereas an L level signal outputted from the address decoder 2 is supplied to the column driver 2 through the inverter 8.

A description will next be made of a case in which trouble has occurred in the bit line 1 in the array 0.

When the trouble occurs in the bit line 1 in the array 0, the FUSE 01 is cut and the spare bit line 3 is used.

In the initial state, the array selection address signals 0 and 1 are both L in level. First, the array selection address signal 0 is brought to an H level, which in turn is inputted to the control electrode of the PTr 000 and the input terminal of the inverter 003. In doing so, the PTr 000 is turned OFF so that an L level is outputted from the inverter 003. Since, however, the FUSE 01 has been cut, an L level outputted from the inverter 002 is not transferred over the FUSE 01.

Thus, since the input of the inverter 002 remains at the H level, the output of the inverter 002 becomes the L level and the PTr 001 remains held ON. Consequently, the supply of an H level from the ground terminal VDD is not cut off, and the corresponding FUSE that reaches the L level in response to the L level outputted from the inverter 003, results in the FUSE 00 alone. Since one input terminal of the NAND 10 goes L in level in a manner similar to the case in which no FUSE is cut, the output of the NAND 10 reaches an H level. Thus, the operations of the address decode circuit and the column selection circuit connected to the NAND 10 remains unchanged in a manner to the case where the FUSE 01 is not cut. Since, however, both input terminals of the NAND 11 are H in level, an L level is outputted from the NAND 11.

The inverter 1 outputs an H level in response to the L level output produced from the NAND 11. Further, the inverter 4 outputs an L level in response to the H level output sent from the inverter 1. Furthermore, the transfer gate 2 is turned OFF and the transfer gate 3 is turned ON in response to the potentials respectively outputted from the inverters 1 and 4. That is, a signal produced from the corresponding address decoder is not outputted to the inverter 7 but brought into a state of being outputted to the inverter 8.

While the address decoder 1 is outputting the H level in the initial state, the address decoder 1 outputs an L level in response to the signals delivered from the predecode signal lines 0 through M. The L level is cut off by the transfer gate 2 and passes through the transfer gate 3, followed by being supplied to the inverter 8. In doing so, the inverter 8 outputs an H level.

The H level outputted from the inverter 8 is supplied to the column driver 2 together with the H level signal of the column driver line YCLK, so that the column driver 2 outputs a column selection signal to its corresponding bit line 2.

On the other hand, the L level outputted from the inverter 0 is inputted to the control electrode of the PTr 2 so that the PTr 2 is turned ON. Also the L level outputted from the inverter 4 is inputted to its corresponding control terminal of the PTr 3 so that the PTr 3 is also turned ON. Accordingly, the H level is inputted from the power supply terminal VDD to the inverter 7 from which an L level signal is inputted to the column driver 1. Thus, even though the column driver line YCLK becomes H in level, the column driver 1 does not output a column selection signal.

Since the address decode circuit and the column selection circuit connected to the NAND 12 are operated in like manner, an L level signal outputted from the address decoder 2 is supplied to the column driver 3 via the inverter 9.

Though the example in which the array 0 is operated, has been explained above, the array selection address signal 1 may be activated where the array 1 is operated. Since the FUSEs 10 through 12 are respectively in a non-cut state, the array 1 can be activated in a redundant relief-free state regardless of the presence or absence of cutting of the FUSEs 00 through 02. When trouble occurs in the array 1, any of the FUSEs 10 through 12 is cut off. That is, the corresponding FUSE to be cut according to the trouble-produced array is selected and the corresponding array selection address signal activated according to the array to be activated is selected, thereby making it possible to perform redundant relief corresponding to the trouble-produced array.

First Preferred Embodiment

Figure 4:
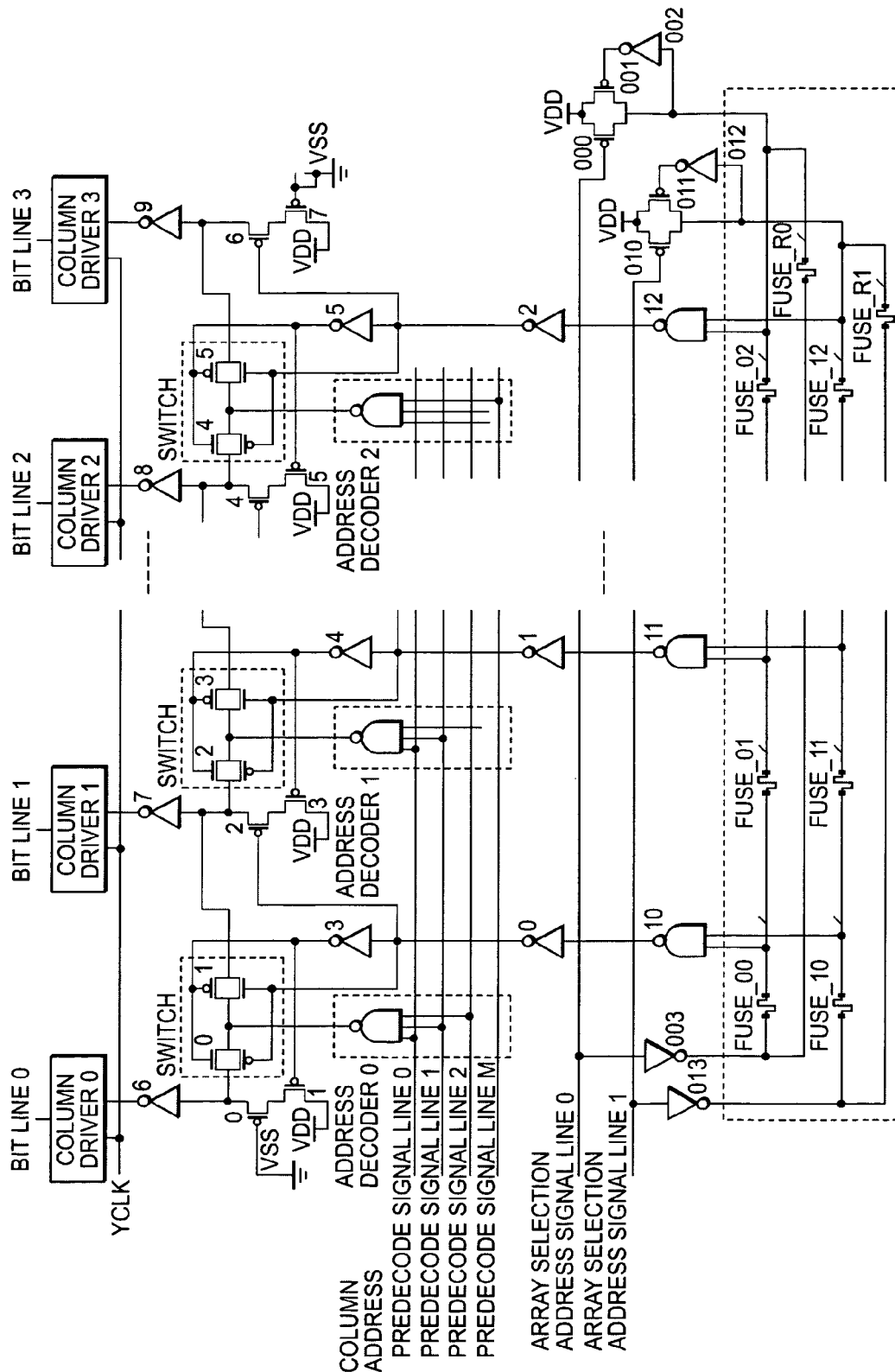
FIG. 4 is a circuit diagram showing a first embodiment of the present invention.

FIG. 4 is a circuit diagram showing a first embodiment of the present invention. The first embodiment of the present invention will be explained using FIG. 4.

The first embodiment is basically identical in circuit configuration to the circuit basic to the present invention. In the circuit basic to the present invention, the output terminal of the inverter 003 and the other main electrode of the PTr 000 are connected to each other via the FUSEs 00 through 02. In contrast, in the first embodiment of the present invention, an output terminal of an inverter 003 and the other main electrode of a PTr 000 are connected to each other via a cutoff fuse (FUSE) R0. FUSEs 00 through 02 and FUSE R0 are placed in a parallel-connection relationship.

Similarly, an output terminal of an inverter 013 and the other main electrode of the PTr 010 are connected to each other via not only FUSEs 10 through 12 but also a cutoff FUSE R1. As a matter of course, the FUSEs 10 through 12 and FUSE R1 are placed in a parallel connection relationship.

Subsequently, the operation of the first embodiment will be explained using FIG. 4.

The operation thereof at the time that no trouble occurs in each bit line and a spare bit line 3 is not used, is basically identical to the operation of the conventional circuit. First, an array selection address signal 0 is brought to an H level. In doing so, the PTr 000 is turned OFF so that an L level is outputted from the inverter 003. Therefore, an H level is outputted from the inverter 002 so that a PTr 001 is also turned OFF. Accordingly, the supply of an H level from VDD is cut off so that all potentials of the FUSEs 00 through 02 become L in level in response to the L level outputted from the inverter 003.

In the first embodiment, however, the output terminal of the inverter 003 and the other main electrode of the PTr 000 are connected to each other via the cut-off off FUSE R0. Since only one FUSE exists in a wiring in which the FUSE R0 is placed, the resistance of the wiring is low. Thus, the L level outputted from the inverter 003 is promptly transferred to the inverter 002 with being little affected by the wiring resistance.

The subsequent operation is identical to the conventional circuit. Since one input terminals of NANDs 10 through 12 become L in level in response to the L level outputted from the inverter 003, the outputs of the NANDs 10 through 12 become H in level.

A description will next be made of a case in which since trouble has occurred in the bit line 1 in the array 0, the FUSE 01 is cut and the spare bit line 3 is used.

When the trouble occurs in the bit line 1 in the array 0, the FUSE 01 is cut in a manner similar to the conventional circuit. In the first embodiment of the present invention, however, even the FUSE R0 is further cut. Consequently, the signal outputted from the inverter 003 is not transmitted over the FUSE 01. The subsequent operation is similar to the circuit basic to the present invention.

In the first embodiment of the present invention as described above, the low resistance wiring has been connected in parallel with each wiring having the redundancy relieving fuses. Therefore, the outputs of the inverters 003 and 013 are immediately transferred to their corresponding wirings. Thus, it is possible to obtain a redundancy relieving circuit adaptable even to a high frequency operation.

Second Preferred Embodiment

Figure 5:
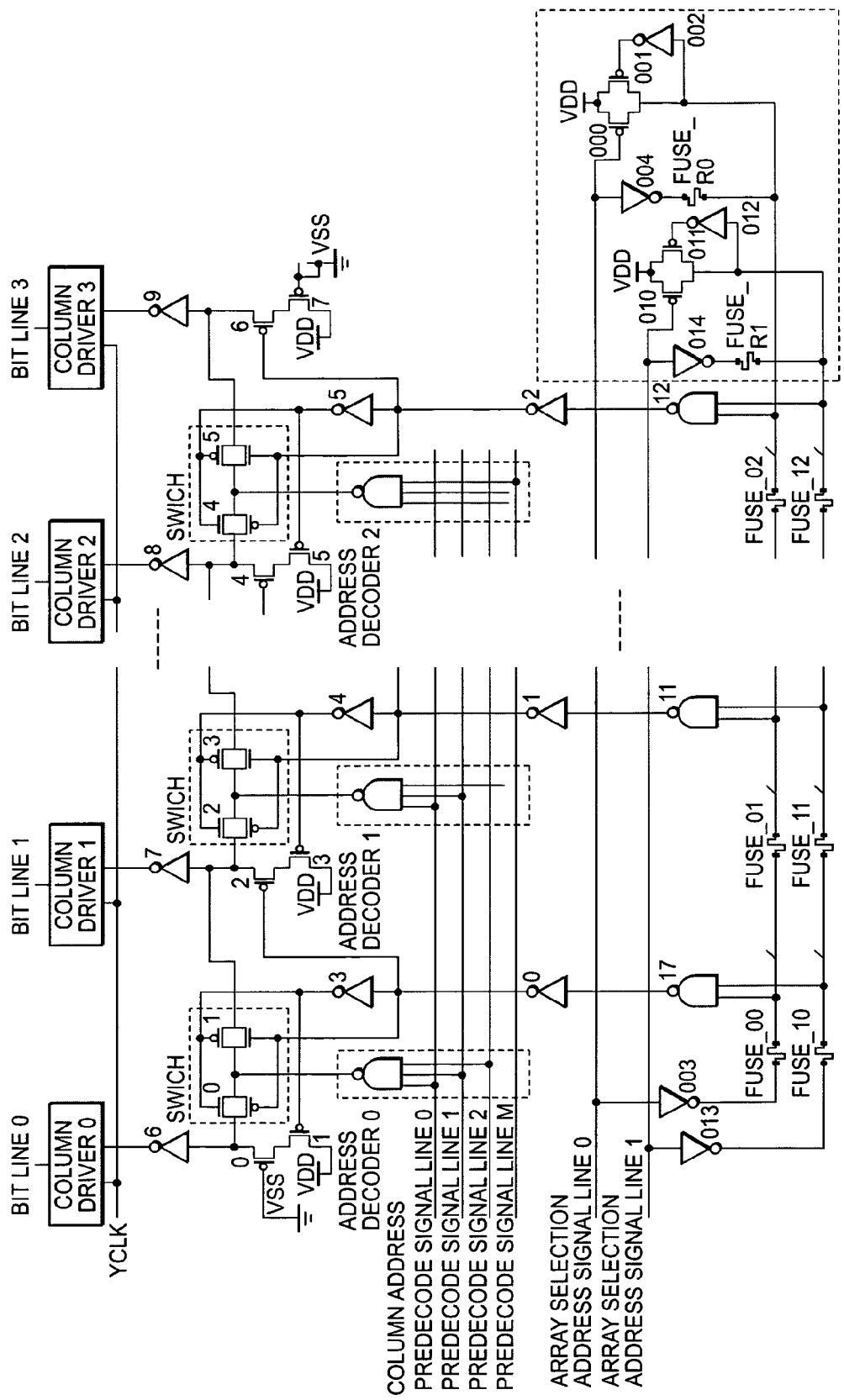
FIG. 5 is a circuit diagram illustrating a second embodiment of the present invention.

FIG. 5 is a circuit diagram showing a second embodiment of the present invention. The second embodiment of the present invention will be explained below using FIG. 5.

The second embodiment is basically identical in circuit configuration to the circuit basic to the invention. The second embodiment is different from the circuit basic to the invention in that an inverter 004 and a cutoff fuse (FUSE) R0 are newly provided, a control terminal of a PTr 000 is connected to an input terminal of the inverter 004, and an output terminal of the inverter 004 is connected to the other main electrode of the PTr 000 through the FUSE R0.

Further, the second embodiment is newly provided with an inverter 014 and a FUSE R1. A control terminal of a PTr 010 is connected to an input terminal of the inverter 014, and an output terminal of the inverter 014 is connected to the other main electrode of the PTr 010 through the FUSE R1.

Subsequently, the operation of the second embodiment will be described using FIG. 5.

First of all, the operation thereof at the time that no trouble occurs in each bit line and no spare bit line 3 is used, is basically identical to the operation of the conventional circuit. An array selection address signal 0 is first brought to an H level. In doing so, the PTr 000 is turned OFF so that an L level is outputted from an inverter 003. Therefore, an H level is outputted from an inverter 002 so that a PTr 001 is also turned OFF. Accordingly, the supply of an H level from VDD is cut off, so that all potentials of FUSEs 00 through 02 become L in level in response to the L level outputted from the inverter 003.

In the second embodiment, however, the input terminal of the inverter 003 and the other main electrode of the PTr 000 are connected to each other via the inverter 004 and the FUSE R0. Since only one FUSE exists in a wiring extending to the PTr 000 via the inverter 004 and the FUSE R0, the resistance of the wiring is small. Thus, an L level outputted from the inverter 004 is immediately transferred to the inverter 002 with being little affected by the wiring resistance before the L level outputted from the inverter 003 is transferred to the inverter 002.

The subsequent operation is identical to the conventional circuit. Since one input terminals of NANDs 10 through 12 become L in level in response to the L levels outputted from the inverters 003 and 004, the outputs produced from the NANDs 10 through 12 become H in level.

A description will next be made of a case in which since trouble has occurred in the bit line 1 in the array 0, the FUSE 01 is cut and the spare bit line 3 is used.

When the trouble occurs in the bit line 1 in the array 0, the FUSE 01 is cut in a manner similar to the conventional circuit. In the second embodiment of the present invention, however, even the FUSE R0 is further cut. Consequently, the output from the inverter 003 is not transmitted over the FUSE 01 and at the same time the output from the inverter 004 is not transmitted over the FUSE R0. The subsequent operation is similar to the circuit basic to the present invention.

As described above, the second embodiment of the present invention brings about an effect similar to the first embodiment. Since there is no need to dispose the wirings having the cutoff fuses in parallel with the wirings having the redundancy relieving fuses as in the first embodiment, the area of the circuit can be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A redundancy relieving circuit comprising:
an array selection circuit;
an address decode circuit; and
a bit line selection circuit,
wherein said array selection circuit comprises first and second inverters, first and second transistors, a plurality of redundancy relieving fuses and cutoff fuses,
wherein the first and second transistors include one main electrodes and the other main electrodes respectively connected to one another, any of said one main electrodes being connected to a power supply terminal,
wherein each of the first inverters includes an input terminal connected to the other main electrode of the second transistor and an output terminal connected to a control electrode of the second transistor,
wherein each of the second inverters includes an input terminal connected to a control electrode of the first transistor and an output terminal connected to the other main electrode of the first transistor,
wherein the plurality of redundancy relieving fuses are disposed in series between the output terminals of the second inverters and the other main electrodes of the first transistors respectively,
wherein each of the cutoff fuses is disposed between the output terminal of the second inverter and the other main electrode of the first transistor and in parallel with the redundancy relieving fuses,
wherein said address decode circuit has address decoders, and
wherein said address decode circuit selectively outputs signals sent from the address decoders to said bit line selection circuit in response to potentials among the redundancy relieving fuses in said array selection circuit.

2. The redundancy relieving circuit according to claim 1, wherein said array selection circuit is provided in plural form, and
said address decode circuit receives the potentials from the plurality of array selection circuits respectively.

3. The redundancy relieving circuit according to claim 2, wherein said address decode circuit receives the potentials from the plurality of array selection circuits through NAND circuits respectively.

4. The redundancy relieving circuit according to claim 1, further including respective two transfer gates, wherein the transfer gates are operated in accordance with the potentials from said array selection circuits to selectively output the signals outputted from the address decoders to said bit line selection circuit.

5. The redundancy relieving circuit according to claim 1, further including third and fourth transistors,
wherein said third and fourth transistors are series-connected to one another,
wherein one main electrodes of said fourth transistors are connected to the power supply terminal,
wherein one main electrodes of said third transistors are connected to the other main electrodes of said fourth transistors and the other main electrodes thereof are connected to said bit line selection circuit, respectively, and
wherein the potential of the power supply terminal is outputted to said bit line selection circuit according to cutting of the redundancy relieving fuses and the cutoff fuses.

6. A redundancy relieving circuit comprising:
an array selection circuit;
an address decode circuit; and
a bit line selection circuit,
wherein said array selection circuit comprises first, second and third inverters, first and second transistors, a plurality of redundancy relieving fuses and cutoff fuses,
wherein the first and second transistors include one main electrodes and the other main electrodes respectively connected to one another, any of said one main electrodes being connected to a power supply terminal,
wherein each of the first inverters includes an input terminal connected to the other main electrode of the second transistor and an output terminal connected to a control electrode of the second transistor,
wherein each of the second inverters includes an input terminal connected to a control electrode of the first transistor and an output terminal connected to the other main electrode of the first transistor,
wherein each of the third inverters includes an input terminal connected to the control electrode of the first transistor and an output terminal connected to the other main electrode of the first transistor via the corresponding cutoff fuse,
wherein the plurality of redundancy relieving fuses are disposed in series between the output terminals of the second inverters and the other main electrodes of the first transistors respectively,
wherein said address decode circuit has address decoders, and
wherein said decode circuit selectively outputs signals sent from the address decoders to said bit line selection circuit in response to potentials among the redundancy relieving fuses in said array selection circuit.

7. The redundancy relieving circuit according to claim 6, wherein said array selection circuit is provided in plural form, and
said address decode circuit receives the potentials from the plurality of array selection circuits respectively.

8. The redundancy relieving circuit according to claim 7, wherein said address decode circuit receives the potentials from the plurality of array selection circuits through NAND circuits respectively.

9. The redundancy relieving circuit according to claim 6, further including respective two transfer gates, wherein the transfer gates are operated in accordance with the potentials from said array selection circuits to selectively output the signals outputted from the address decoders to said bit line selection circuit.

10. The redundancy relieving circuit according to claim 6, further including third and fourth transistors,
wherein said third and fourth transistors are series-connected to one another,
wherein one main electrodes of said fourth transistors are connected to the power supply terminal,
wherein one main electrodes of said third transistors are connected to the other main electrodes of said fourth transistors and the other main electrodes thereof are connected to said bit line selection circuit, respectively, and
wherein the potential of the power supply terminal is outputted to said bit line selection circuit according to cutting of the redundancy relieving fuses and the cutoff fuses.

* * * * *